United States Patent
Okada et al.

(10) Patent No.: US 9,048,424 B2
(45) Date of Patent: Jun. 2, 2015

(54) SEMICONDUCTOR DEVICE AND METHOD OF MANUFACTURING THE SAME

(75) Inventors: Takayuki Okada, Tokyo (JP); Tetsu Morooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/122,567

(22) PCT Filed: Mar. 1, 2012

(86) PCT No.: PCT/JP2012/055164
§ 371 (c)(1),
(2), (4) Date: Nov. 26, 2013

(87) PCT Pub. No.: WO2012/164989
PCT Pub. Date: Dec. 6, 2012

(65) Prior Publication Data
US 2014/0077145 A1 Mar. 20, 2014

(30) Foreign Application Priority Data
May 31, 2011 (JP) .................................. 2011-121905

(51) Int. Cl.
*H01L 21/20* (2006.01)
*H01L 45/00* (2006.01)
*H01L 27/06* (2006.01)
(Continued)

(52) U.S. Cl.
CPC ............ *H01L 45/16* (2013.01); *H01L 27/0629* (2013.01); *H01L 27/0802* (2013.01); *H01L 45/12* (2013.01); *H01L 27/101* (2013.01)

(58) Field of Classification Search
USPC .......... 438/705, 751, 754; 257/2; 216/87, 101
See application file for complete search history.

(56) References Cited

U.S. PATENT DOCUMENTS

| 4,419,812 | A | * | 12/1983 | Topich | 438/238 |
| 5,075,250 | A | * | 12/1991 | Hawkins et al. | 438/21 |
| 5,514,612 | A | * | 5/1996 | Rao et al. | 438/382 |

(Continued)

FOREIGN PATENT DOCUMENTS

| JP | 2004-140508 | 5/2004 |
| JP | 2004-221234 | 8/2004 |

(Continued)

OTHER PUBLICATIONS

International Search Report for corresponding PCT Application No. PCT/JP2012/055164, dated Jun. 5, 2012, 2pgs.

(Continued)

*Primary Examiner* — Caleb Henry
(74) *Attorney, Agent, or Firm* — Knobbe, Martens Olson & Bear, LLP

(57) ABSTRACT

The method of manufacturing a semiconductor device selectively forms a resist film on the multilayer gate film and the gate side wall insulating film extending on the semiconductor substrate. An upper part of the gate side wall insulating film and the hard mask film selectively are removed by etching using the resist film as a mask so as to expose a surface of the metal film. the metal film and the barrier metal film adjoining the metal film are removed, by wet etching. After the removal of the resist film, embedding a space formed by removal of the metal film and the barrier metal film and depositing a pre-metal dielectric to a level higher than an upper surface of the remaining hard mask film. A top part of the pre-metal dielectric is planarized by CMP using the remaining hard mask film as a stopper.

16 Claims, 21 Drawing Sheets

(51) Int. Cl.
*H01L 27/08* (2006.01)
*H01L 27/10* (2006.01)

(56) References Cited

U.S. PATENT DOCUMENTS

| | | | |
|---|---|---|---|
| 5,780,333 A * | 7/1998 | Kim | 438/238 |
| 6,001,663 A * | 12/1999 | Ling et al. | 438/17 |
| 6,110,772 A * | 8/2000 | Takada et al. | 438/238 |
| 6,124,160 A * | 9/2000 | Segawa et al. | 438/238 |
| 6,279,585 B1 * | 8/2001 | Shiraki et al. | 134/1.3 |
| 6,497,824 B1 * | 12/2002 | Chen et al. | 216/16 |
| 7,851,891 B2 | 12/2010 | Sengoku et al. | |
| 7,883,983 B2 | 2/2011 | Hase | |
| 8,927,385 B2 * | 1/2015 | Nandakumar et al. | 438/382 |
| 2001/0046771 A1 | 11/2001 | Steinmann et al. | 438/689 |
| 2002/0151148 A1 * | 10/2002 | Racanelli | 438/385 |
| 2003/0052386 A1 * | 3/2003 | Yamaguchi | 257/536 |
| 2003/0222317 A1 * | 12/2003 | Yoshizawa | 257/393 |
| 2004/0140508 A1 | 7/2004 | Sengoku et al. | |
| 2005/0101034 A1 * | 5/2005 | Aggarwal et al. | 438/3 |
| 2005/0263823 A1 * | 12/2005 | Hwang et al. | 257/368 |
| 2006/0145296 A1 * | 7/2006 | Coolbaugh et al. | 257/536 |
| 2007/0128790 A1 * | 6/2007 | Dainin | 438/238 |
| 2008/0003762 A1 * | 1/2008 | Park | 438/382 |
| 2009/0001517 A1 * | 1/2009 | Swanson et al. | 257/539 |
| 2009/0090977 A1 * | 4/2009 | Freeman et al. | 257/379 |
| 2009/0101994 A1 * | 4/2009 | Moon | 257/412 |
| 2009/0206454 A1 | 8/2009 | Sengoku et al. | |
| 2009/0230542 A1 * | 9/2009 | Lin et al. | 257/700 |
| 2009/0283840 A1 * | 11/2009 | Coolbaugh et al. | 257/379 |
| 2009/0286378 A1 * | 11/2009 | Hase | 438/382 |
| 2009/0302384 A1 * | 12/2009 | Izumi | 257/339 |
| 2010/0009510 A1 * | 1/2010 | Hashimoto | 438/382 |
| 2010/0308436 A1 * | 12/2010 | Nanjo | 257/536 |
| 2010/0320509 A1 * | 12/2010 | Knorr et al. | 257/288 |
| 2010/0320544 A1 * | 12/2010 | Tseng et al. | 257/380 |
| 2010/0328022 A1 * | 12/2010 | Fan et al. | 338/309 |
| 2011/0057267 A1 * | 3/2011 | Chuang et al. | 257/380 |
| 2011/0111567 A1 * | 5/2011 | Tsutsumi et al. | 438/238 |
| 2011/0117710 A1 * | 5/2011 | Lin et al. | 438/238 |
| 2011/0189827 A1 * | 8/2011 | Hsu et al. | 438/238 |
| 2011/0280064 A1 * | 11/2011 | Noshiro | 365/158 |
| 2012/0009757 A1 * | 1/2012 | Jung | 438/382 |
| 2012/0126369 A1 * | 5/2012 | Lin et al. | 257/532 |
| 2012/0178234 A1 * | 7/2012 | Lee et al. | 438/382 |
| 2012/0292740 A1 * | 11/2012 | Lin et al. | 257/536 |
| 2012/0305880 A1 * | 12/2012 | Zhang et al. | 257/4 |

FOREIGN PATENT DOCUMENTS

| | | |
|---|---|---|
| JP | 2005-142346 | 6/2005 |
| JP | 2007-324292 | 12/2007 |
| JP | 2009-283497 | 12/2009 |
| JP | 2010-272598 | 12/2010 |
| JP | 2011-100910 | 5/2011 |

OTHER PUBLICATIONS

International Search Report and Written Opinion for corresponding PCT Application No. PCT/JP2012/055164, filed Mar. 1, 2012, dated Dec. 27, 2013, 5 pgs.

* cited by examiner

SEMICONDUCTOR DEVICE AND METHOD OF MANUFACTURING THE SAME

TECHNICAL FIELD

The present invention relates to a semiconductor storage device and a method of manufacturing the same.

BACKGROUND ART

In a conventional poly-metal gate process, a polysilicon resistor contains a metal and therefore has a low resistance.

Therefore, if a resistive element is formed by the polysilicon resistor, a problem arises that the resulting circuit has a large area.

DISCLOSURE OF THE INVENTION

A method of manufacturing a semiconductor device, according to an embodiment is a method of manufacturing a semiconductor device in which a resistive element is formed from a silicon film used in a multilayer gate film of a MOS transistor. forming a multilayer film on a semiconductor substrate with an element isolation insulating film selectively formed thereon, the multilayer film including a silicon film stacked on the semiconductor substrate, a barrier metal film that prevents diffusion of a metal into the silicon film stacked on the silicon film, a metal film containing the metal stacked on the barrier metal film and a hard mask film stacked on the metal film. The method of manufacturing a semiconductor device forms the multilayer gate film by selectively etching the multilayer film to an upper surface of the semiconductor substrate. The method of manufacturing a semiconductor device forms a gate side wall insulating film on a side surface of the multilayer gate film. The method of manufacturing a semiconductor device selectively forms a resist film on the multilayer gate film and the gate side wall insulating film extending on the semiconductor substrate in a resistive element region in which the resistive element is to be formed. The method of manufacturing a semiconductor device selectively removes by etching an upper part of the gate side wall insulating film and the hard mask film using the resist film as a mask so as to expose a surface of the metal film. The method of manufacturing a semiconductor device removes, by wet etching, the metal film and the barrier metal film adjoining the metal film in a region where the metal film is exposed and in a region above the silicon film where the hard mask film remains in the resistive region. The method of manufacturing a semiconductor device removes the resist film after the wet etching. The method of manufacturing a semiconductor device, after the removal of the resist film, embedding a space formed by removal of the metal film and the barrier metal film and depositing a pre-metal dielectric to a level higher than an upper surface of the remaining hard mask film. The method of manufacturing a semiconductor device planarizes by CMP a top part of the pre-metal dielectric using the remaining hard mask film as a stopper.

Figure 15:
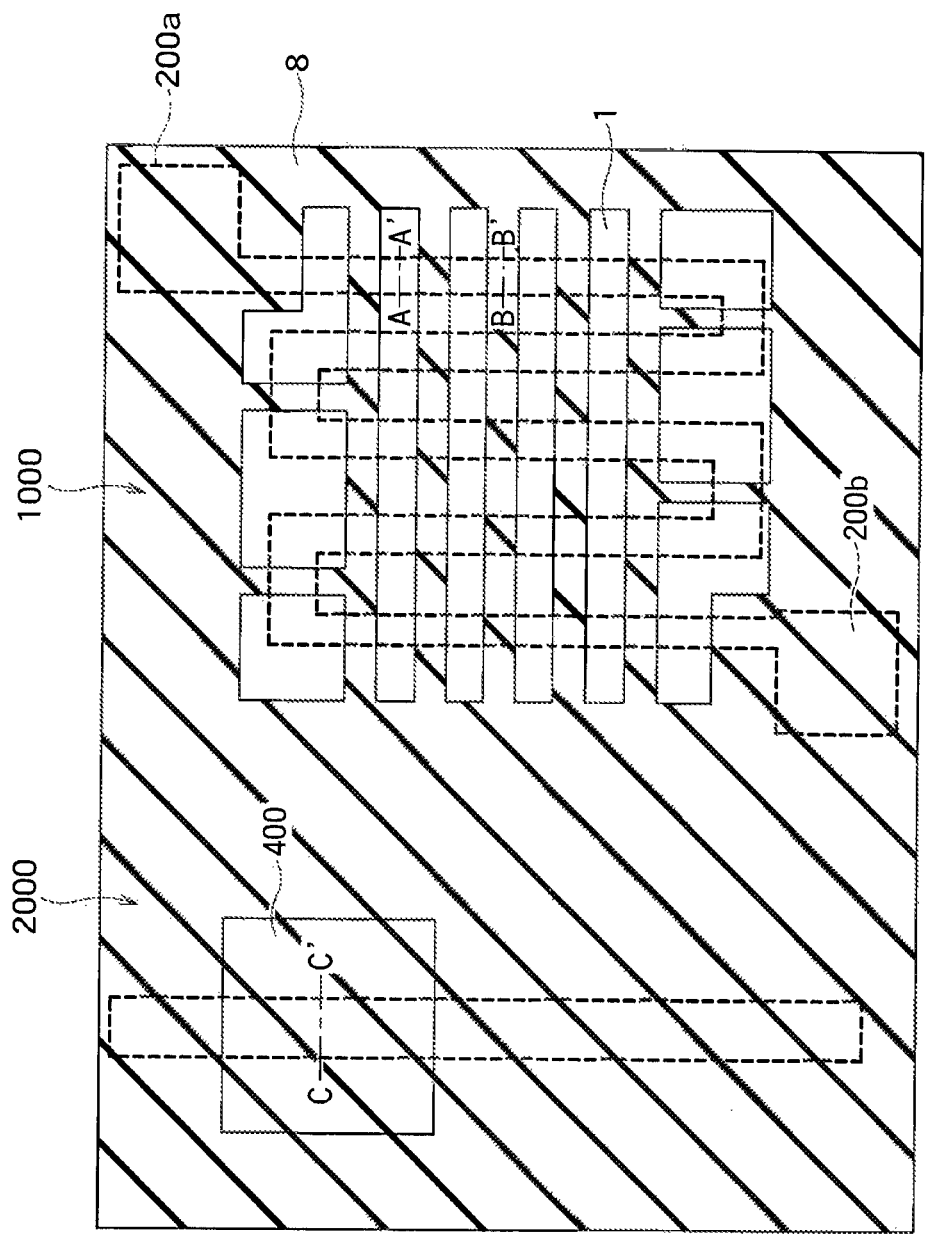
FIG. 15 is a plan view showing an example of a step following the step shown in FIG. 14 in the method of manufacturing a semiconductor device according to the second embodiment.
Figure 19:
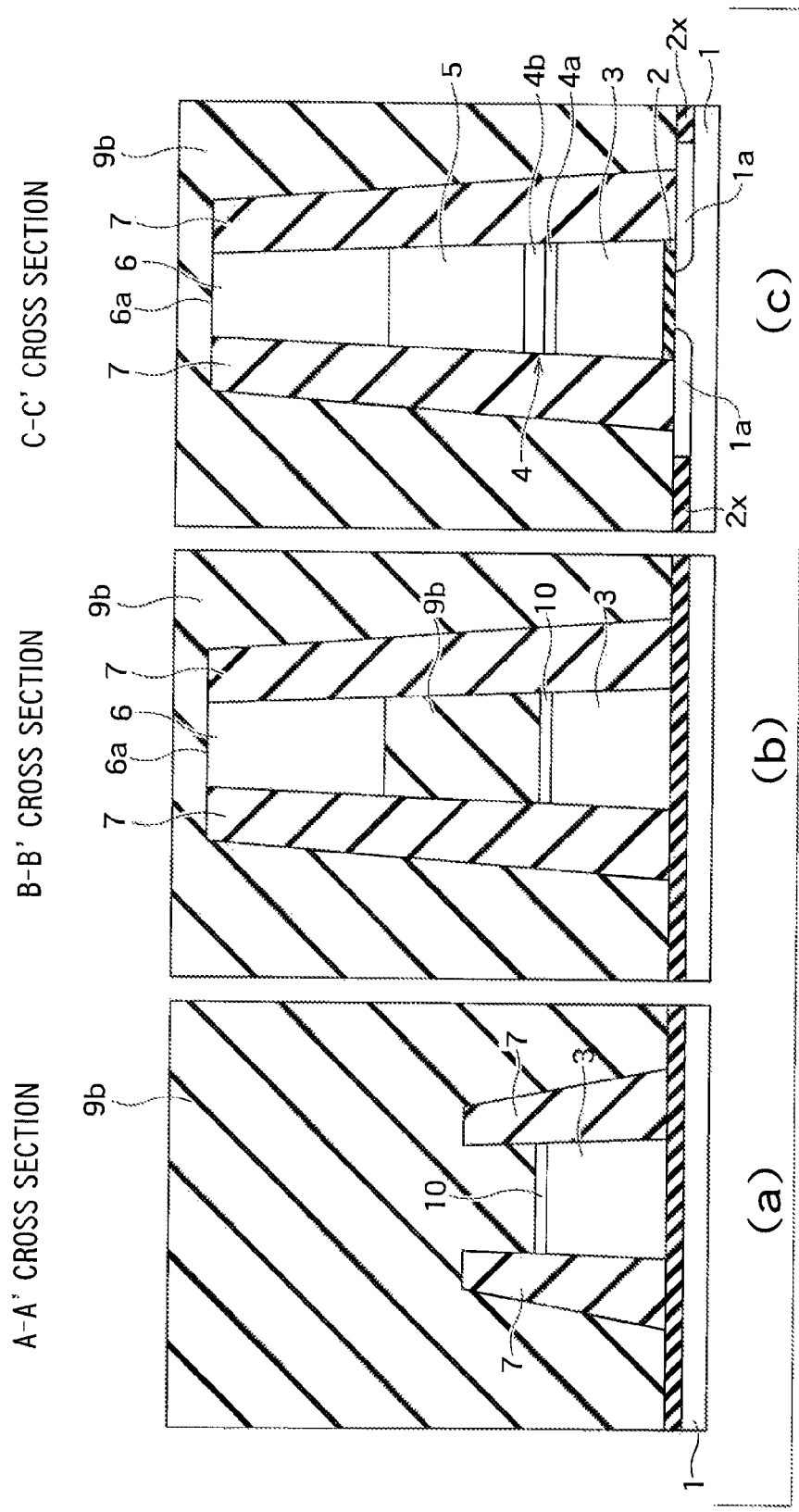
FIG. 19 is cross-sectional views showing examples of cross sections taken along the A-A' line, the B-B' line and the C-C' line in FIG. 15 in steps in the method of manufacturing a semiconductor device according to the second embodiment, is continuous from FIG. 18.
Figure 20:
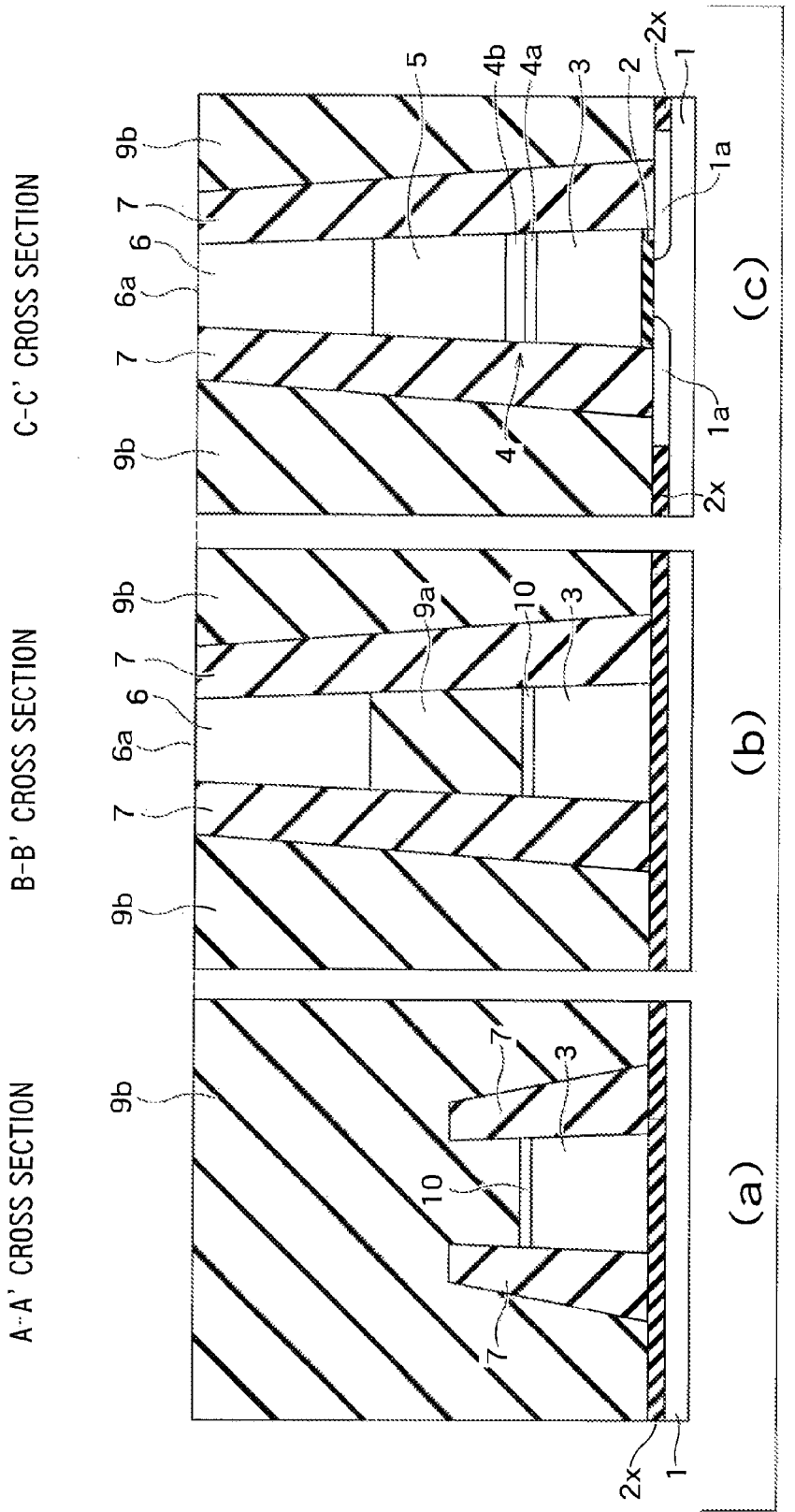

FIG. 20 is cross-sectional views showing examples of cross sections taken along the A-A' line, the B-B' line and the C-C' line in FIG. 15 in steps in the method of manufacturing a semiconductor device according to the second embodiment, is continuous from FIG. 19.

Figure 21:
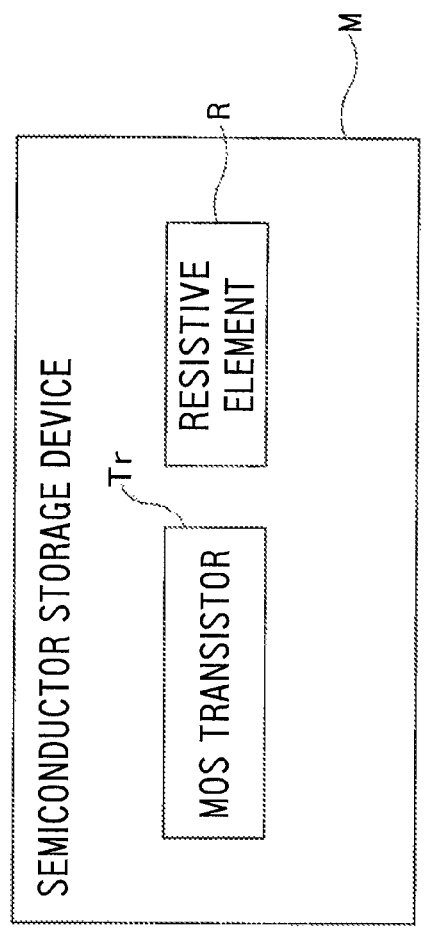

FIG. 21 is a block diagram showing an example of a configuration of a semiconductor storage device according to the third embodiment.

COMPARATIVE EXAMPLE

For example, there is a technique of increasing the resistance of a resistive element having a polysilicon resistor by removing a hard mask film and a metal film in a region in which the polysilicon resistor is formed.

However, the region from which the hard mask and the metal are removed is lower than the other regions. As a result, the region from which the hard mask and the metal are removed can suffer from dishing in planarization by chemical mechanical polishing (CMP).

In view of such circumstances, in the embodiments described below, the hard mask and side wall removal patterns for the poly-metal gate formed in the poly-metal gate process are improved.

A technique of forming a polysilicon resistive element in a poly-metal gate process by removing a metal on a polysilicon while leaving a hard mask so as to prevent occurrence of dishing in a subsequent CMP step will be described.

In the following, embodiments will be described with reference to the drawings.

First Embodiment

In a first embodiment, a method of manufacturing a semiconductor device in which a resistive element is formed from a silicon film used in a multilayer gate film of a MOS transistor will be described, focusing on a resistive element region in which the resistive element is formed.

Figure 1:
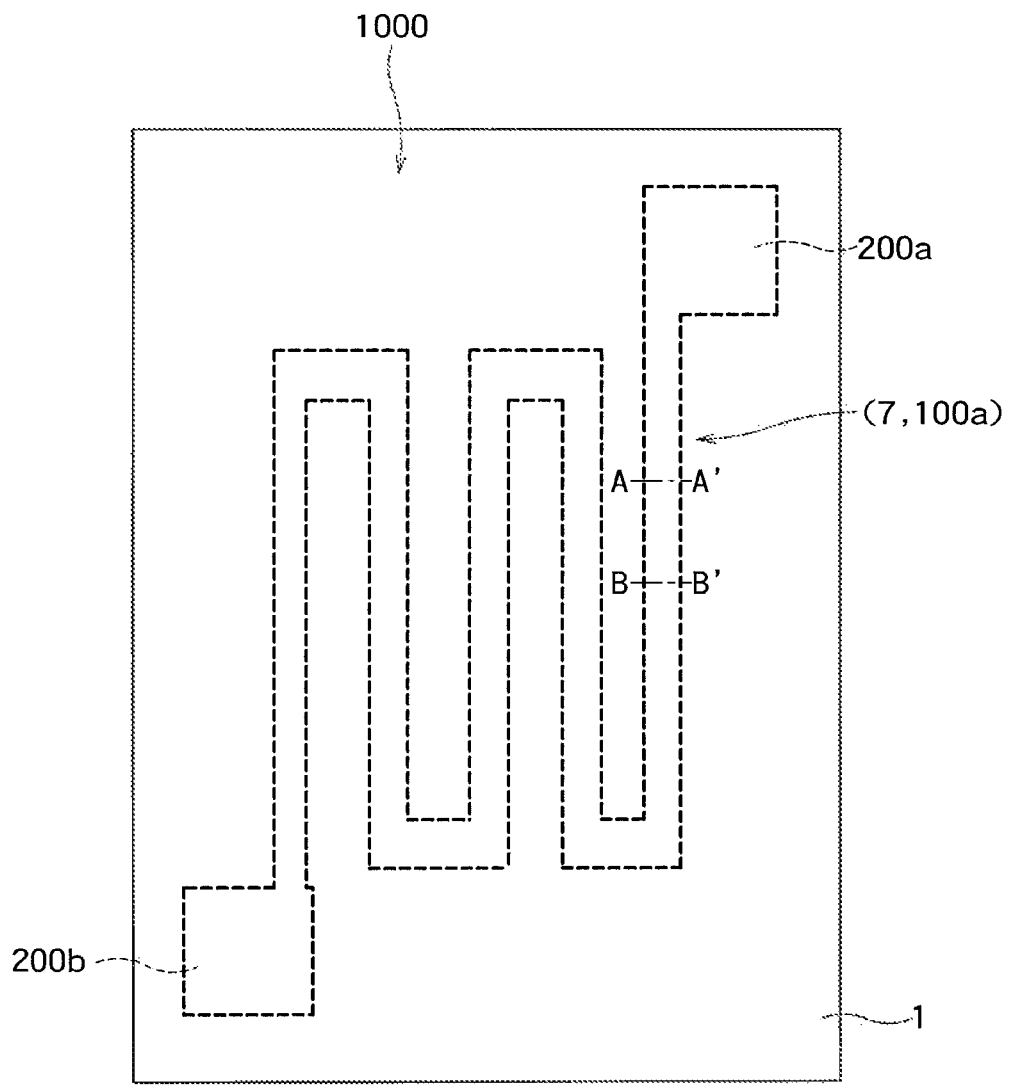
FIG. 1 is a plan view showing an example of a step in the method of manufacturing a semiconductor device according to the first embodiment.
Figure 2:
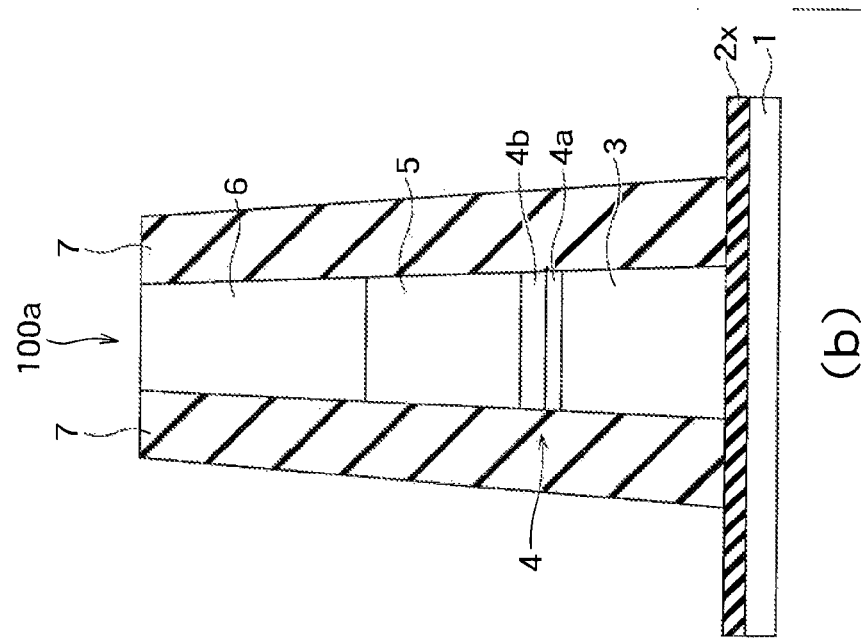
FIG. 2 are cross-sectional views showing examples of cross sections taken along the A-A' line and the B-B' line in FIG. 1.
Figure 2:
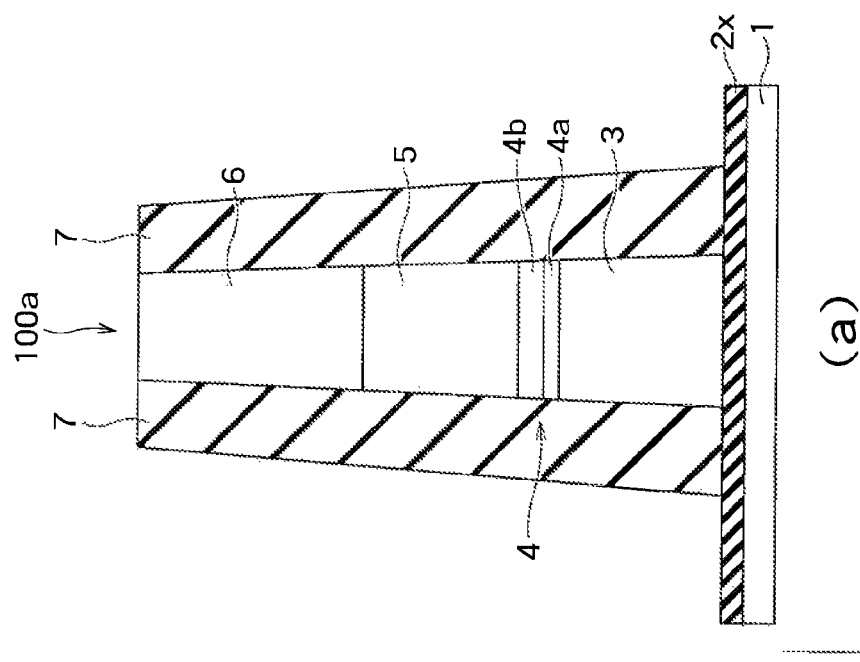
Figure 3:
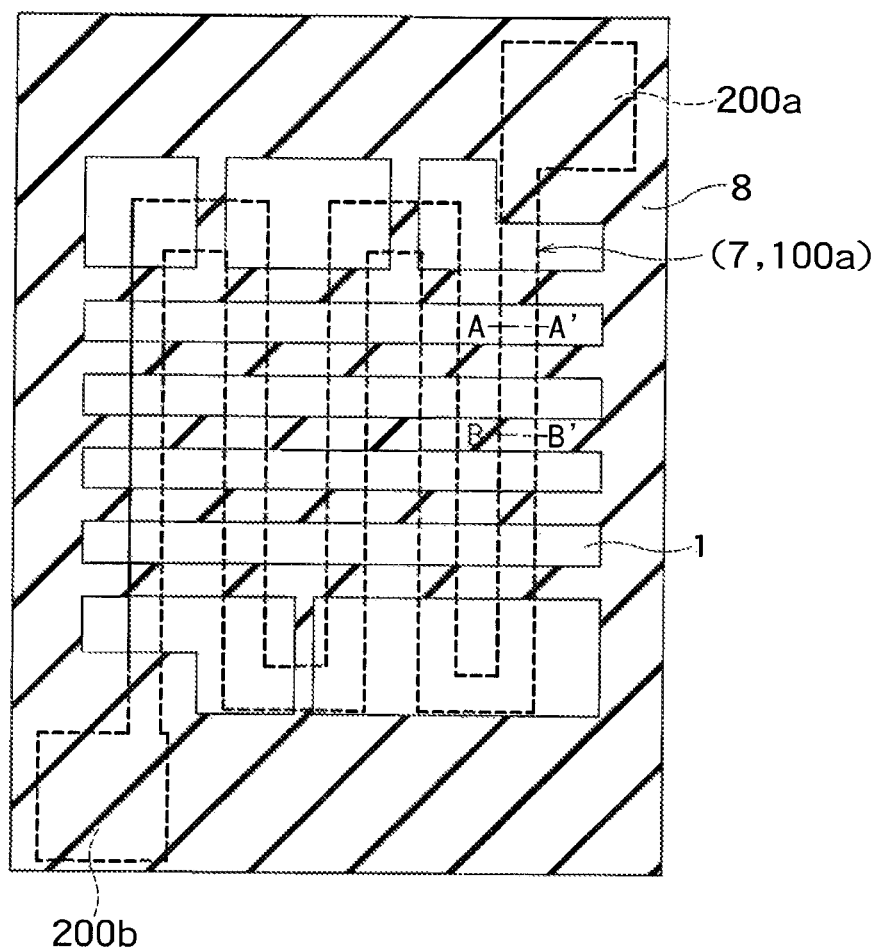
FIG. 3 is a plan view showing an example of a step following the step shown in FIG. 1 in the method of manufacturing a semiconductor device.
Figure 4:
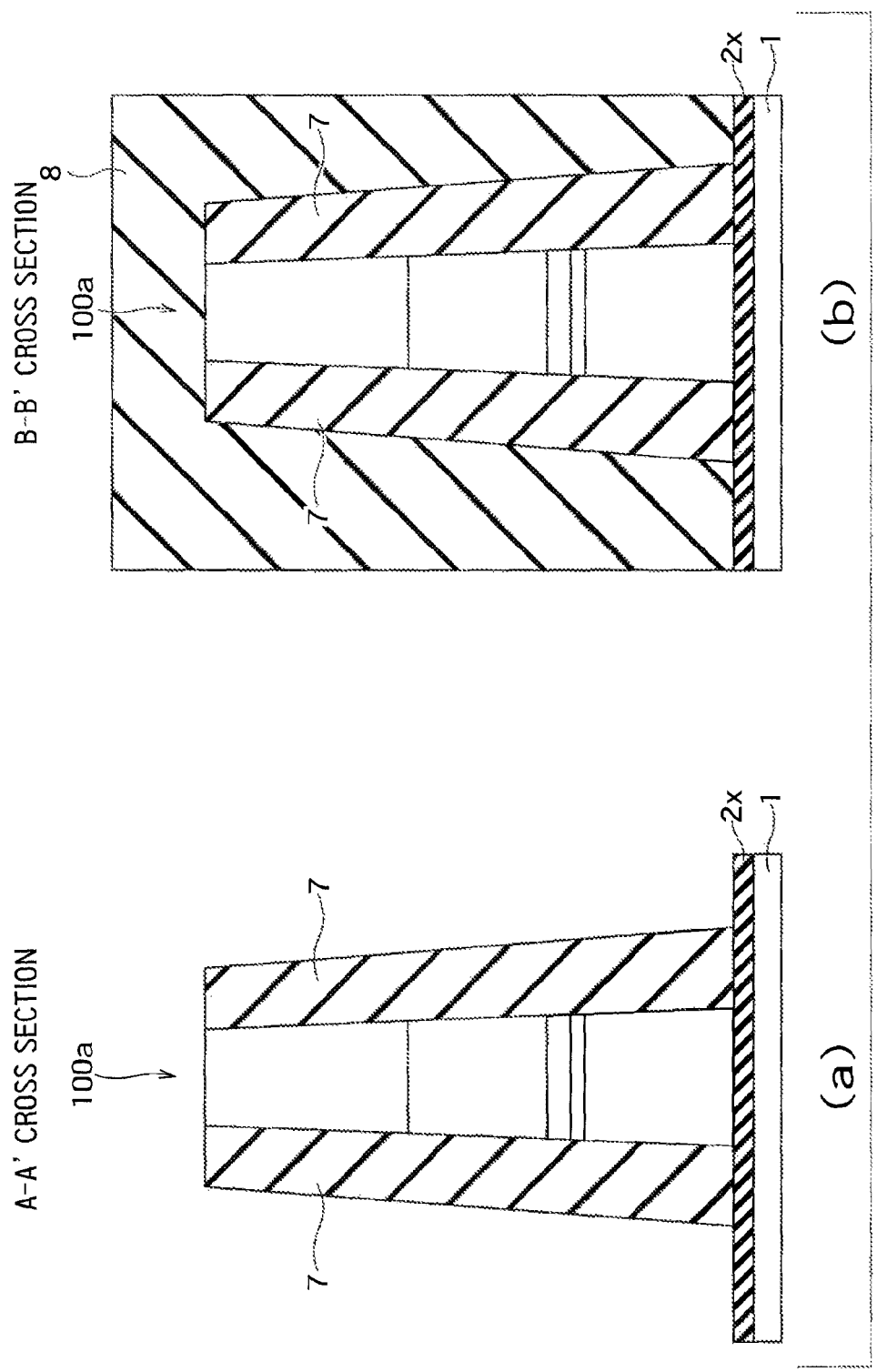
FIG. 4 are cross-sectional views showing examples of cross sections taken along the A-A' line and the B-B' line in FIG. 3.

FIG. 1 is a plan view showing an example of a step in the method of manufacturing a semiconductor device according to the first embodiment. FIG. 2 are cross-sectional views showing examples of cross sections taken along the A-A' line and the B-B' line in FIG. 1. FIG. 3 is a plan view showing an example of a step following the step shown in FIG. 1 in the method of manufacturing a semiconductor device. FIG. 4 are cross-sectional views showing examples of cross sections taken along the A-A' line and the B-B' line in FIG. 3. FIGS. 5 to 8 includes cross-sectional views showing examples of cross sections taken along the A-As line and the B-B' line in steps following the step shown in FIG. 3 in the method of manufacturing a semiconductor device. In FIG. 1, for the sake of simplicity, illustration of an element isolation insulating film 2x is omitted.

First, as shown in FIGS. 1 and 2, a multilayer film is formed on a semiconductor substrate 1 with the element isolation insulating film 2x for element isolation selectively formed thereon in a resistive element region, the multilayer film including a silicon film 3, a barrier metal film 4 that prevents diffusion of a metal (tungsten, for example) into the silicon film 3, a metal film 5 containing the metal and a hard mask film 6 stacked one on another in this order. In a transistor region (not shown) of the semiconductor substrate 1, a transistor is formed in a region where the element isolation insulating film 2x is not formed.

The multilayer film is selectively etched to an upper surface of the semiconductor substrate 1 to form a multilayer gate film 100a. A gate side wall insulating film 7 is then formed on the side surface of the multilayer gate film 100a.

In this embodiment, the silicon film 3 is a polysilicon film. Alternatively, the silicon film 3 may be another conductive silicon film, such as an amorphous silicon film.

The barrier metal film 4 contains a titanium (Ti) film 4a formed on the silicon film 3 and a titanium nitride (TiN) film 4b formed on the titanium film 4a. The barrier metal film 4 can be made of any other material, such as WN, that prevents diffusion into the metal film 5.

The metal film 5 is a tungsten (W) film, for example.

The hard mask film 6 is a silicon nitride film, for example. The gate side wall insulating film 7 is formed by an insulating film, such as a silicon nitride film or a silicon oxide film.

As shown in FIG. 1, the multilayer gate film 100a including the silicon film 3 is formed in a substantially zigzag configuration on the semiconductor substrate 1, for example.

As shown in FIG. 1, in a resistive element region 1000 in which the resistive element is to be formed, the silicon film 3 is electrically connected to two resisting electrodes (contacts) 200a and 200b at the opposite ends thereof. The resisting electrodes 200a and 200b are electrically connected to a circuit arrangement of another semiconductor element (not shown).

Next, as shown in FIGS. 3 and 4, in the resistive element region 1000, a resist film 8 is selectively formed on the multilayer gate film 100a and the gate side wall insulating film 7 extending on the semiconductor substrate 1.

In the cross-sectional view of FIG. 4(a), the multilayer gate film 100a and the gate side wall insulating film 7 are exposed. In the cross-sectional view of FIG. 4(b), the resist film 8 is selectively formed on the multilayer gate film 100a and the gate side wall insulating film 7.

In this embodiment, in the resistive element region 1000, the resist film 8 is formed in a line/space pattern on the semiconductor substrate 1 (FIG. 3).

This pattern allows etching in a subsequent wet etching step to proceed from the openings (space parts) in the resist film 8 and the etchant to penetrate to the region under the resist film 8.

Figure 5:
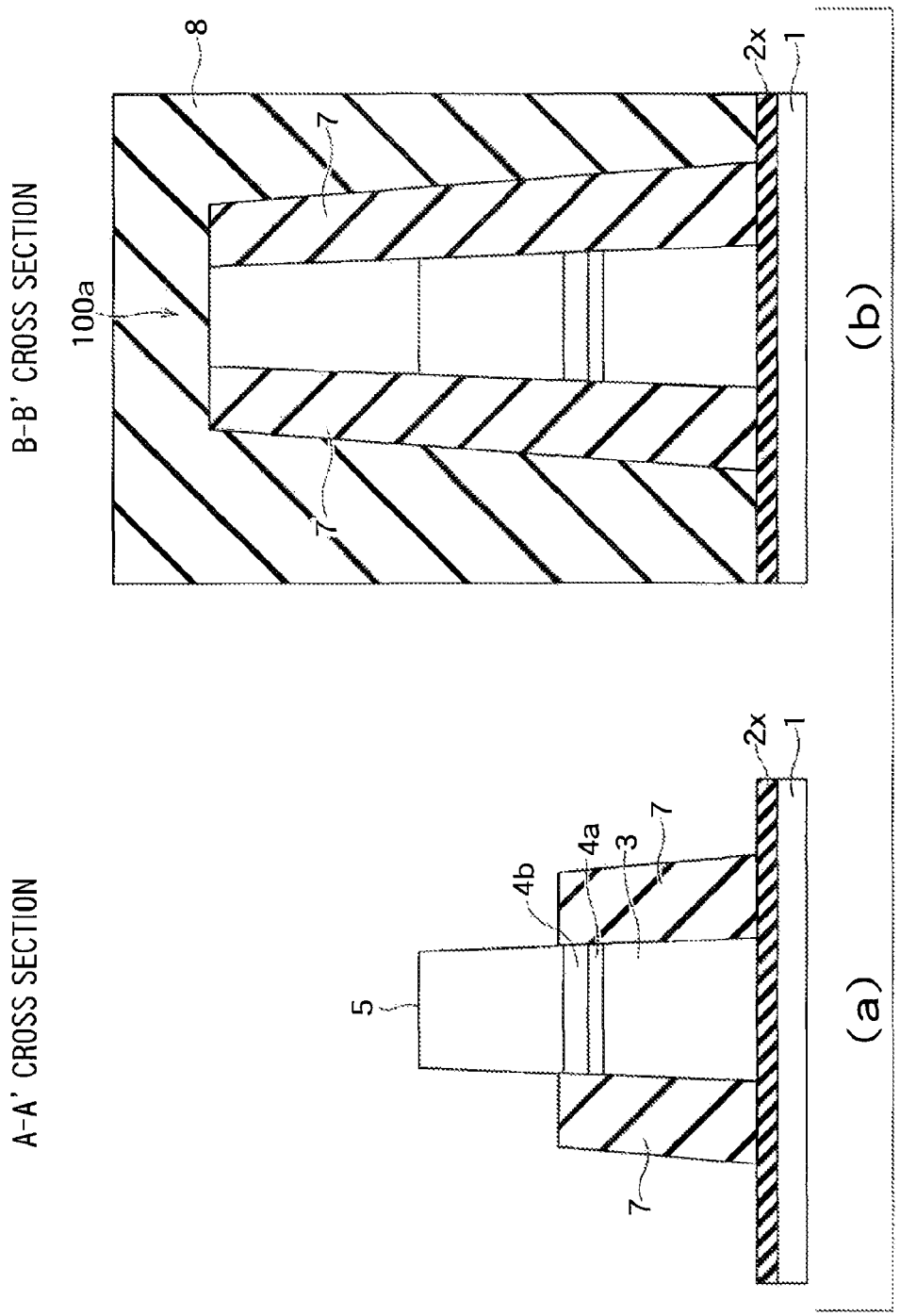
FIG. 5 is cross-sectional views showing examples of cross sections taken along the A-A' line and the B-B' line in steps following the step shown in FIG. 3 in the method of manufacturing a semiconductor device.

Next, as shown in FIG. 5, using the resist film 8 as a mask, an upper part of the gate side wall insulating film 7 and the hard mask film 6 are selectively removed by dry etching, for example, so as to expose the surface of the metal film 5.

In this embodiment, in the etching of the gate side wall insulating film 7, the gate side wall insulating film 7 is etched in such a manner that at least the surface, including the top surface and side surfaces, of the silicon film 3 is not exposed.

Thus, processing of the silicon film 3 occurs only during formation of the multilayer gate film 100a. Metal removal in a subsequent step is performed by highly selective wet etching, so that size variations due to processing of the silicon film 3 can be reduced. That is, variations of the characteristics of the resistive element due to processing of the silicon film 3 can be reduced.

Figure 6:
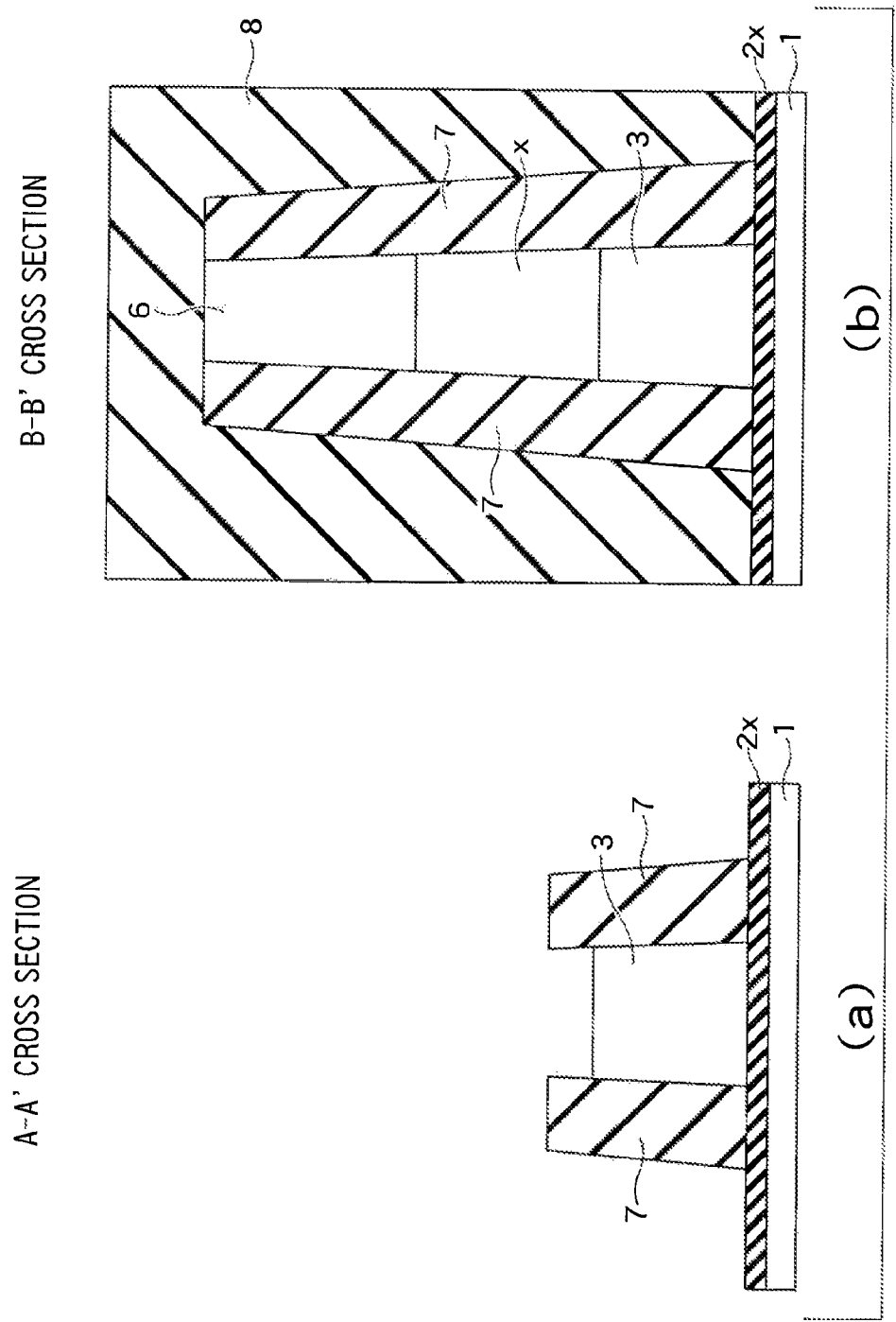
FIG. 6 is cross-sectional views showing examples of cross sections taken along the A-At line and the B-B' line in steps following the step shown in FIG. 3 in the method of manufacturing a semiconductor device, is continuous from FIG. 5.

Next, as shown in FIG. 6, in the resistive element region 1000, the metal film 5 and the barrier metal film 4 adjoining the metal film 5 are removed by wet etching in the region where the metal film 5 is exposed and in a region "x" above the silicon film 3 where the hard mask film 6 remains. The etchant used for the wet etching is sulfuric acid/hydrogen peroxide, for example.

In this way, in the resistive element region 1000, the metal film 5 and the barrier metal film 4 are removed from an upper surface 3a of the silicon film 3. As a result, a polysilicon resistor having a high resistance can be formed in the semiconductor element formed in the poly-metal gate process. That is, a resistive element having a high resistance can be formed while reducing the increase of the circuit footprint.

Since the metal film 5 and the barrier metal film 4 are selectively removed by highly selective wet etching as described above, size variations due to processing of the silicon film 3 can be reduced. That is variations of the characteristics of the resistive element due to processing of the silicon film 3 can be reduced.

Figure 7:
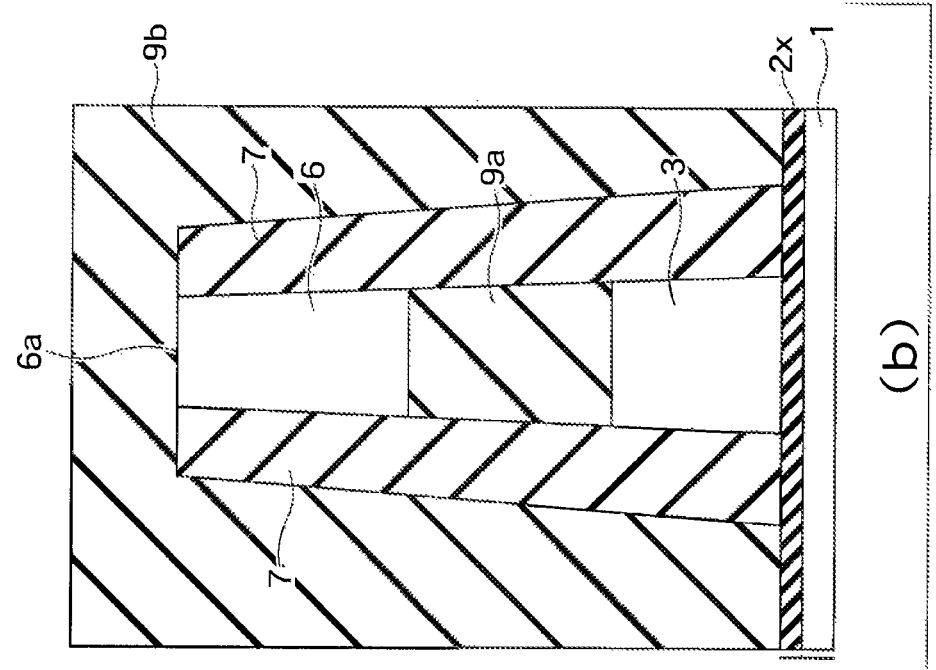
FIG. 7 is cross-sectional views showing examples of cross sections taken along the A-A' line and the B-B' line in steps following the step shown in FIG. 3 in the method of manufacturing a semiconductor device, is continuous from FIG. 6.
Figure 7:
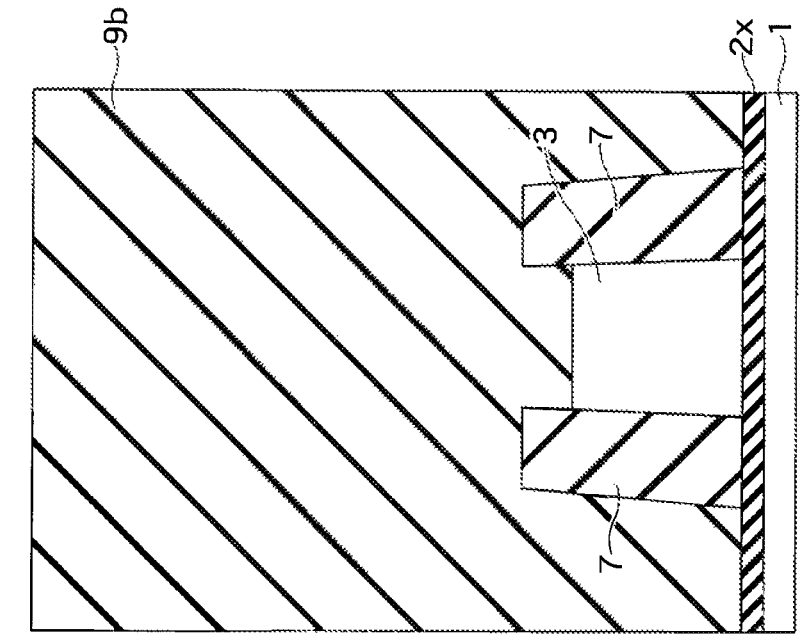

After the wet etching, the resist film 8 is removed. After the resist film 8 is removed, as shown in FIG. 7, spin coating or the like is performed to fill the space formed by removal of the metal film 5 and the barrier metal film 4 with a pre-metal dielectric (PMD) 9a and deposit a PMD 9b to a level higher than an upper surface 6a of the remaining hard mask film 6.

The PMDs 9a and 9b are silicon oxide films, for example.

Figure 8:
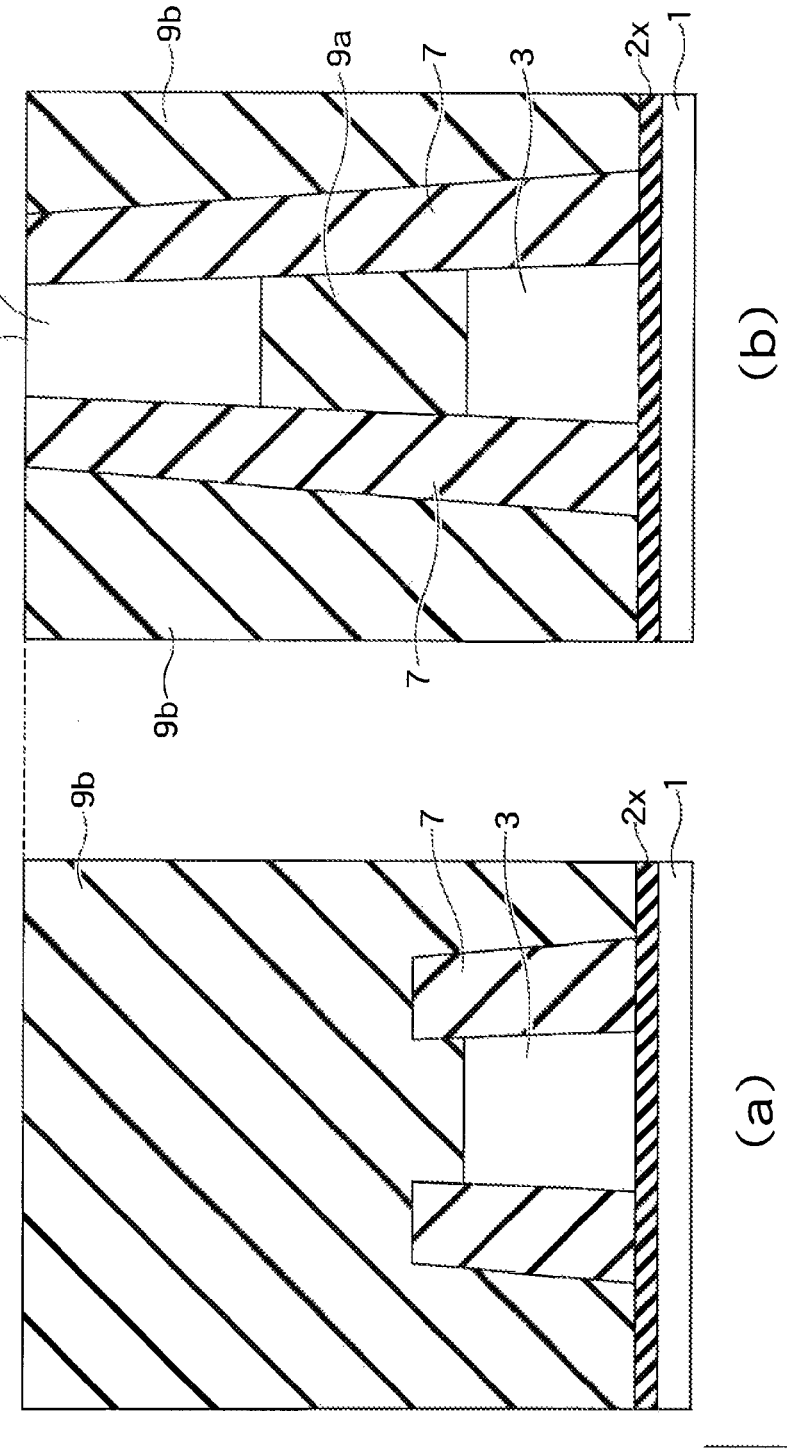
FIG. 8 is cross-sectional views showing examples of cross sections taken along the A-A' line and the B-B' line in steps following the step shown in FIG. 3 in the method of manufacturing a semiconductor device, is continuous from FIG. 7.

Next, as shown in FIG. 8, a top part of the PMD 9b is planarized by CMP using the remaining hard mask film 6 as a stopper. In the CMP planarization, the hard mask film 6 remains on the metal film 5, so that the dishing that occurs in the comparative example described above can be prevented from occurring.

The resistive element formed in the method of manufacturing a semiconductor device according to this embodiment described above includes the semiconductor substrate 1, the multilayer structure film extending on the semiconductor substrate 1, the multilayer structure film being formed by the silicon film 3 stacked on the semiconductor substrate 1, the PMD 9a stacked on the silicon film 3 and the hard mask film 6 stacked on the PMD 9a, the gate side wall insulating film 7 formed on the side surface of the multilayer structure film, and the PMD 9b deposited on the semiconductor substrate 1 to the level of the upper surface of the hard mask. In the resistive element, a part of the gate side wall insulating film 7 and a part of the hard mask film 6 are selectively removed so that the PMDs 9a and 9b are connected to each other, the PMDs 9a and 9b are made of the same material, and the silicon film 3 is electrically connected to the two resisting electrodes 200a and 200b at the opposite ends thereof.

As described above, the resistive element formed in the method of manufacturing a semiconductor device according to the first embodiment is suitable for a multilayer structure, because dishing is unlikely to occur in the CMP planarization.

Figure 9:
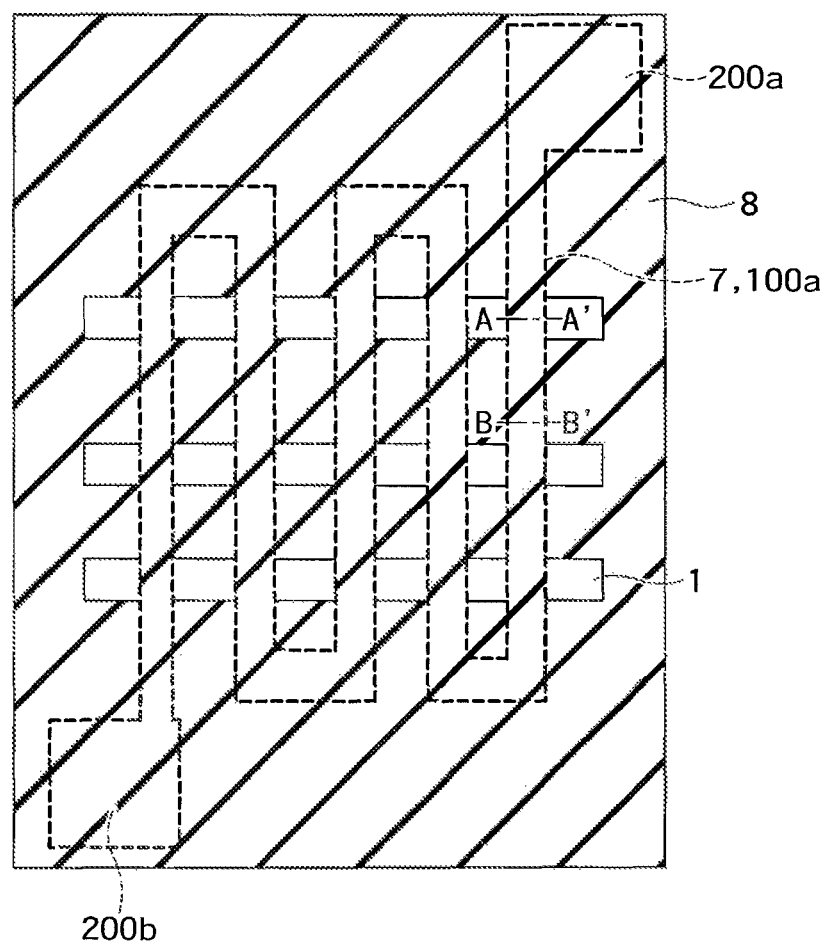
FIG. 9 is a plan view showing another example of a step in the method of manufacturing a semiconductor device according to the first embodiment.

FIG. 9 is a plan view showing another example of a step in the method of manufacturing a semiconductor device according to the first embodiment. In FIG. 9, the same reference numerals denote the same components as those in FIG. 1.

As shown in FIG. 9, in the resistive element region 1000, the resist film 8 can also be formed in a slit pattern on the semiconductor substrate 1, for example.

This pattern also allows etching in the subsequent wet etching step to proceed from the openings (space parts) in the resist film 8 and the etchant to penetrate to the region under the resist film 8.

As described above, according to the method of manufacturing a semiconductor device according to the first embodiment, a resistive element having desired characteristics can be formed with a polysilicon resistor while reducing the increase of the circuit footprint.

Second Embodiment

The above first embodiment has been described focusing on the resistive element region in which the resistive element is formed. In the first embodiment, in the resistive element region, the barrier metal film is formed directly on the silicon film. Therefore, a silicide film is formed at the interface between the silicon film and the barrier metal film. The silicide film is hardly removed by wet etching and can remain. Thus, the resistance of the resistive element is difficult to control.

In view of this, in an second embodiment, an example of a method that prevents formation of such a silicide film in the resistive element region will be described. The second embodiment will be described focusing on two regions, the resistive element region and the transistor region in which a MOS transistor is formed.

Figure 10:
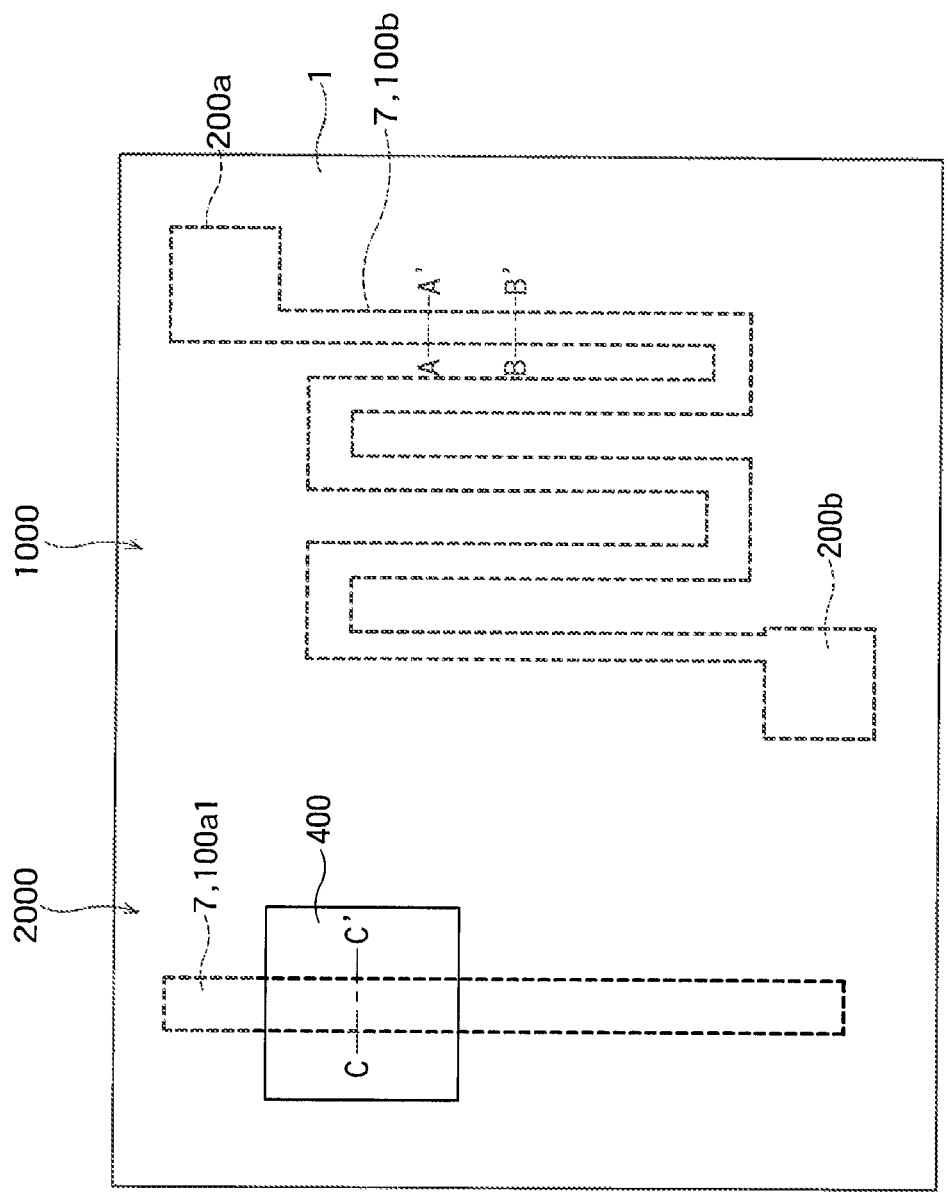
FIG. 10 is a plan view showing an example of a step in a method of manufacturing a semiconductor device according to the second embodiment.

FIG. 10 is a plan view showing an example of a step in a method of manufacturing a semiconductor device according to the second embodiment. FIGS. 11 to 14 are cross-sectional views showing examples of cross sections taken along the A-A' line, the B-B' line and the C-C' line in FIG. 10 in steps in the method of manufacturing a semiconductor device according to the second embodiment. FIG. 15 is a plan view showing an example of a step following the step shown in FIG. 14 in the method of manufacturing a semiconductor device according to the second embodiment. FIGS. 16 to 20 are cross-sectional views showing examples of cross sections taken along the A-A' line, the B-B' line and the C-C' line in FIG. 15 in steps in the method of manufacturing a semiconductor device according to the second embodiment. In FIGS. 10 to 20, the same reference numerals as those in FIGS. 1 to 8 denote the same components as those in the first embodiment.

FIG. 10 shows a state where multilayer gate films 100a and 100b and gate side wall insulating films 7 are formed in a resistive element region 1000 and a transistor region 2000 in which a MOS transistor is to be formed on a semiconductor substrate 1 with an element isolation insulating film 2x selectively formed thereon. The method of manufacturing a semiconductor device according to the second embodiment will be described focusing on the resistive element region 1000 and the transistor region 2000.

Figure 11:
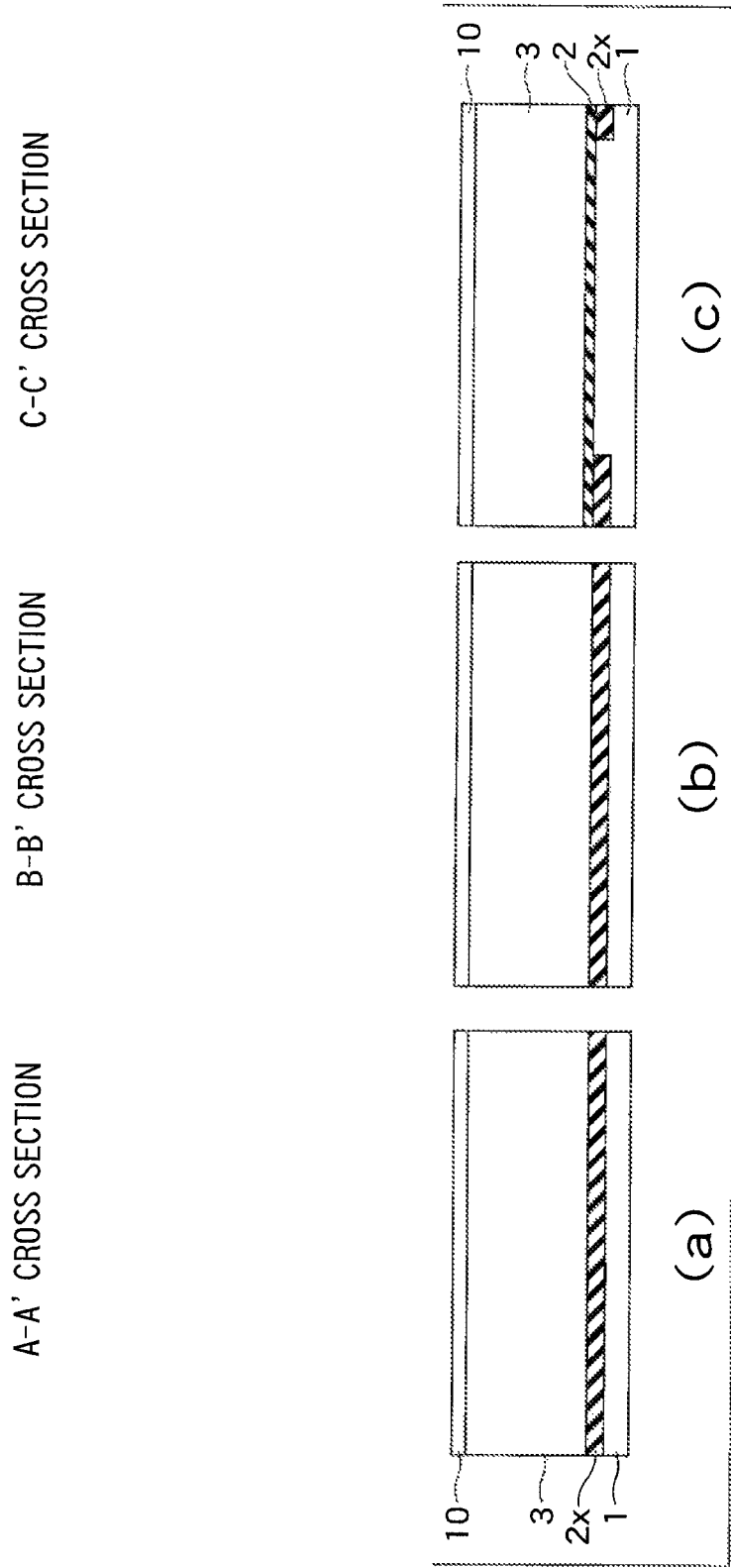
FIG. 11 is cross-sectional views showing examples of cross sections taken along the A-A' line, the B-B' line and the C-C' line in FIG. 10 in steps in the method of manufacturing a semiconductor device according to the second embodiment.

First, as shown in FIG. 11, a silicon film 3 and a protective film 10 are formed in the resistive element region 1000 on the semiconductor substrate 1 with the element isolation insulating film 2x formed thereon, and a gate insulating film 2, a silicon film 3 and a protective film 10 are formed in the transistor region 2000 in which a MOS transistor is to be formed on the semiconductor substrate 1 with the element isolation insulating film 2x selectively formed thereon. The protective film 10 is an insulating film, such as a silicon oxide film and a silicon nitride film.

The conditions of ion implantation to the silicon film 3 in the resistive element region 1000 can be different from the conditions of ion implantation to the silicon film 3 in the transistor region 2000. That is, the impurity concentration of the silicon film 3 in the transistor region 2000 can be different from the impurity concentration of the silicon film 3 in the resistive element region 1000.

Thus, the resistance of the resistive element formed in the resistive element region 1000 can be designed and controlled independently of the conditions of manufacture of the transistor.

Figure 12:
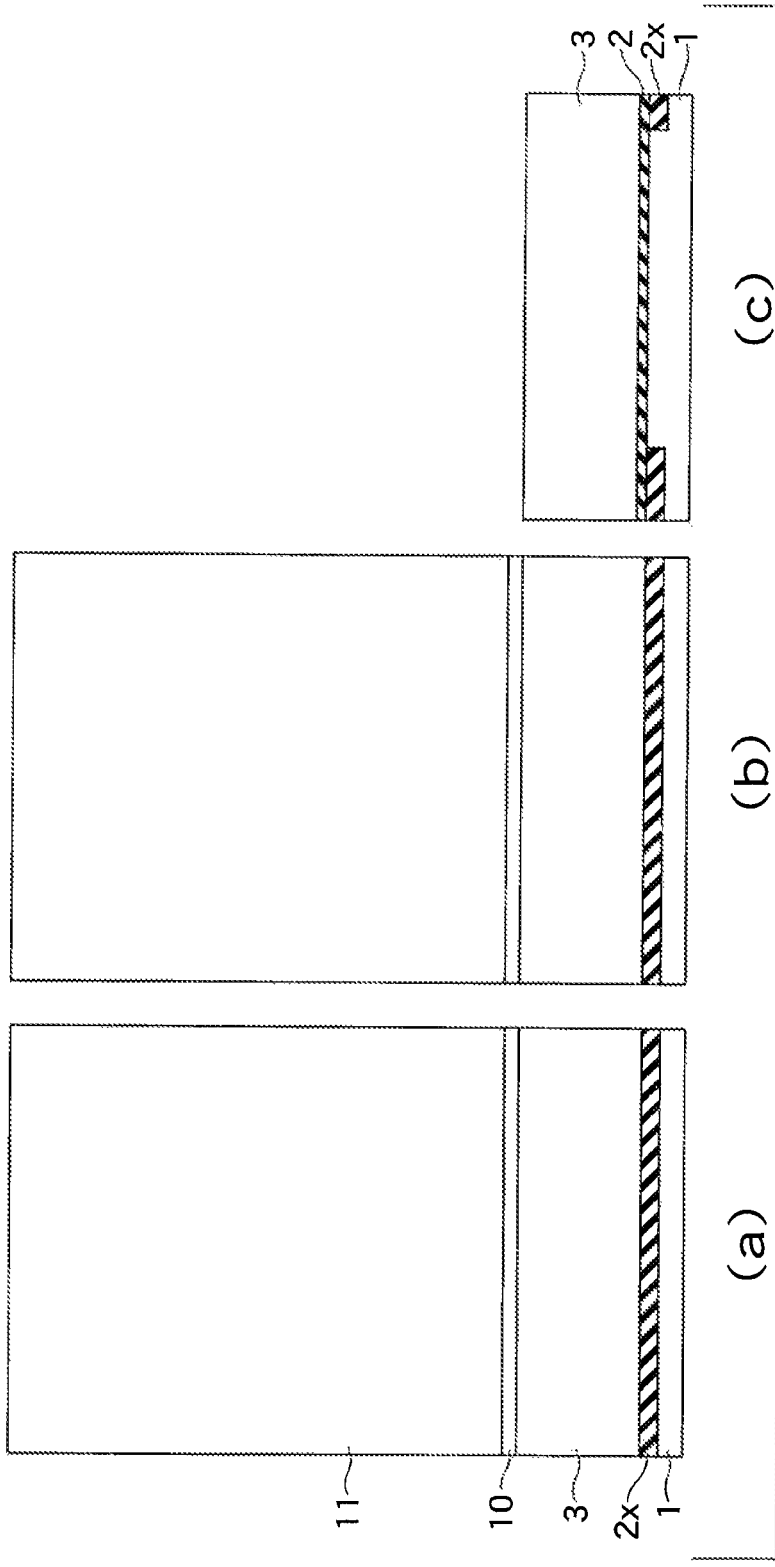
FIG. 12 is cross-sectional views showing examples of cross sections taken along the A-A' line, the B-B' line and the C-C' line in FIG. 10 in steps in the method of manufacturing a semiconductor device according to the second embodiment, is continuous from FIG. 11.

Next, as shown in FIG. 12, in the resistive element region 1000, a resist film 11 is formed on the protective film 10, and the protective film 10 on the silicon film 3 in the transistor region 2000 using the resist film 11 as a mask. In this way, the protective film is removed in a part to be used for a poly-metal gate. In a part to be used for a resistive element of the resistive element region 1000, the protective film 10 exists, and therefore no silicide is formed at the interface between the barrier metal and the silicon.

Figure 13:
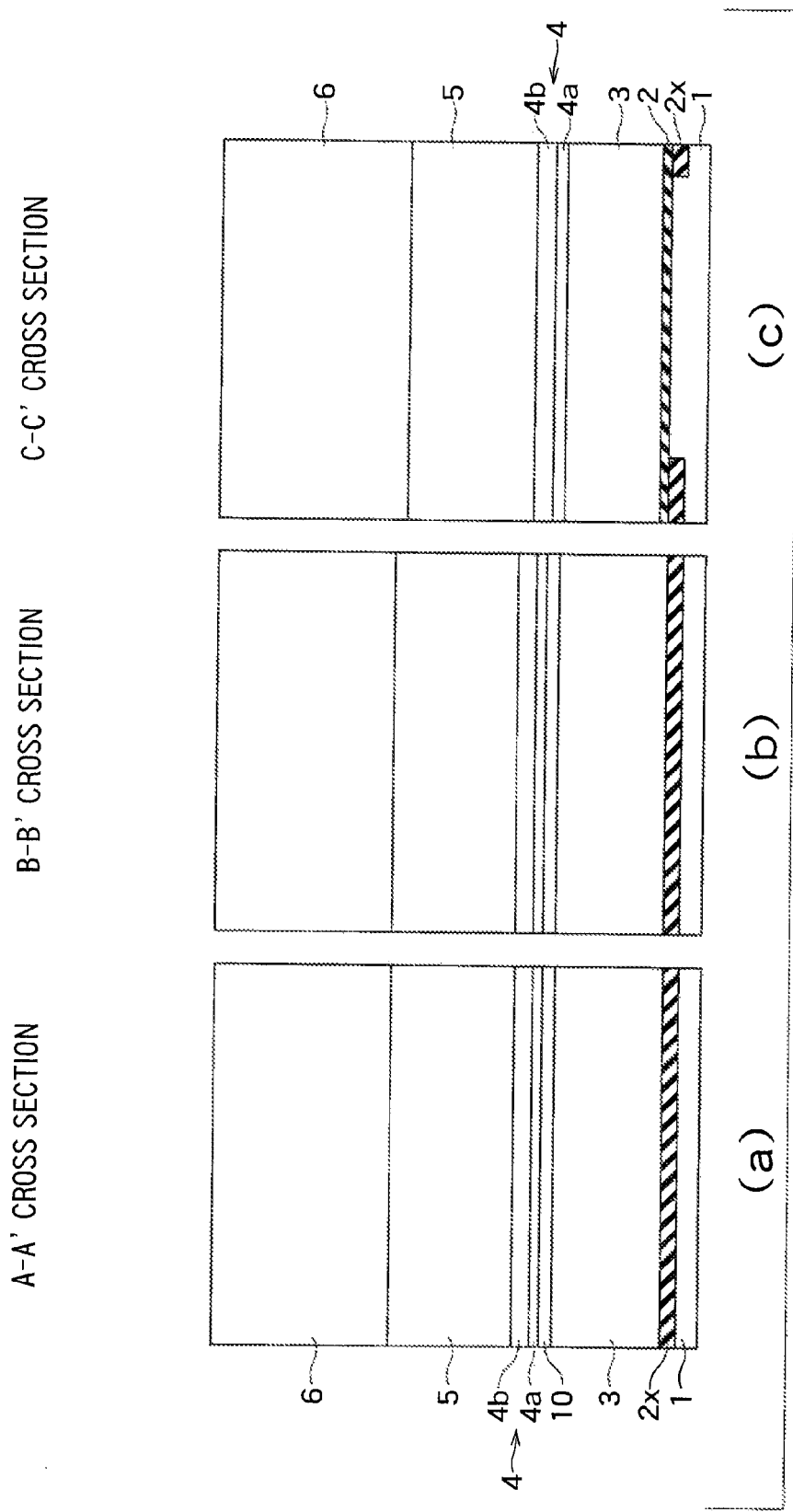
FIG. 13 is cross-sectional views showing examples of cross sections taken along the A-A' line, the B-B' line and the C-C line in FIG. 10 in steps in the method of manufacturing a semiconductor device according to the second embodiment, is continuous from FIG. 12.

Next, as shown in FIG. 13, a barrier metal film 4, a metal film 5 containing a metal and a hard mask film 6 are stacked one on another in this order.

More specifically, in the formation of the multilayer film in the resistive element region 1000, the protective film 10 that prevents formation of silicide is formed on the silicon film 3, and the barrier metal film 4 is formed on the protective film 10.

Figure 14:
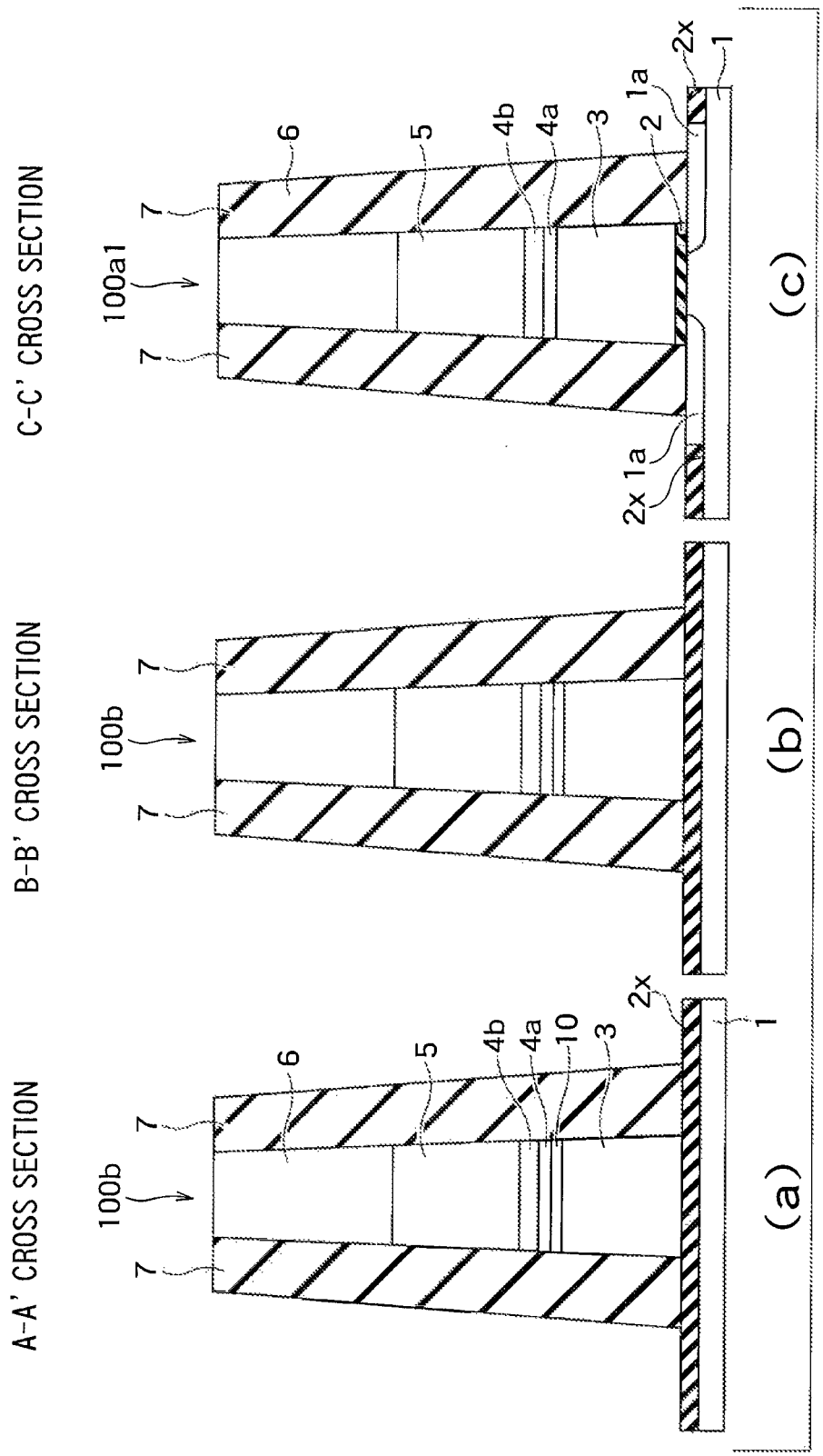
FIG. 14 is cross-sectional views showing examples of cross sections taken along the A-A' line, the B-B' line and the C-C' line in FIG. 10 in steps in the method of manufacturing a semiconductor device according to the second embodiment, is continuous from FIG. 13.

Next, as shown in FIG. 14, the resulting multilayer film is selectively etched to the upper surface of the semiconductor substrate 1, thereby forming multilayer gate films 100a1 and 100b. The gate side wall insulating films 7 are then formed on the side surfaces of the multilayer gate films 100a1 and 100b, and a source-drain region la is formed in the transistor region 2000 by ion implantation.

In this way, in the resistive element region 1000, the multilayer gate film 100b with the protective film 10 formed between the silicon film 3 and the barrier metal film 4 is formed (FIGS. 14(a) and 14(b)), whereas in the transistor region 2000, the multilayer gate film 100a1 with no protective film 10 formed between the silicon film 3 and the barrier metal film 4 is formed (FIG. 14(c)).

Figure 16:
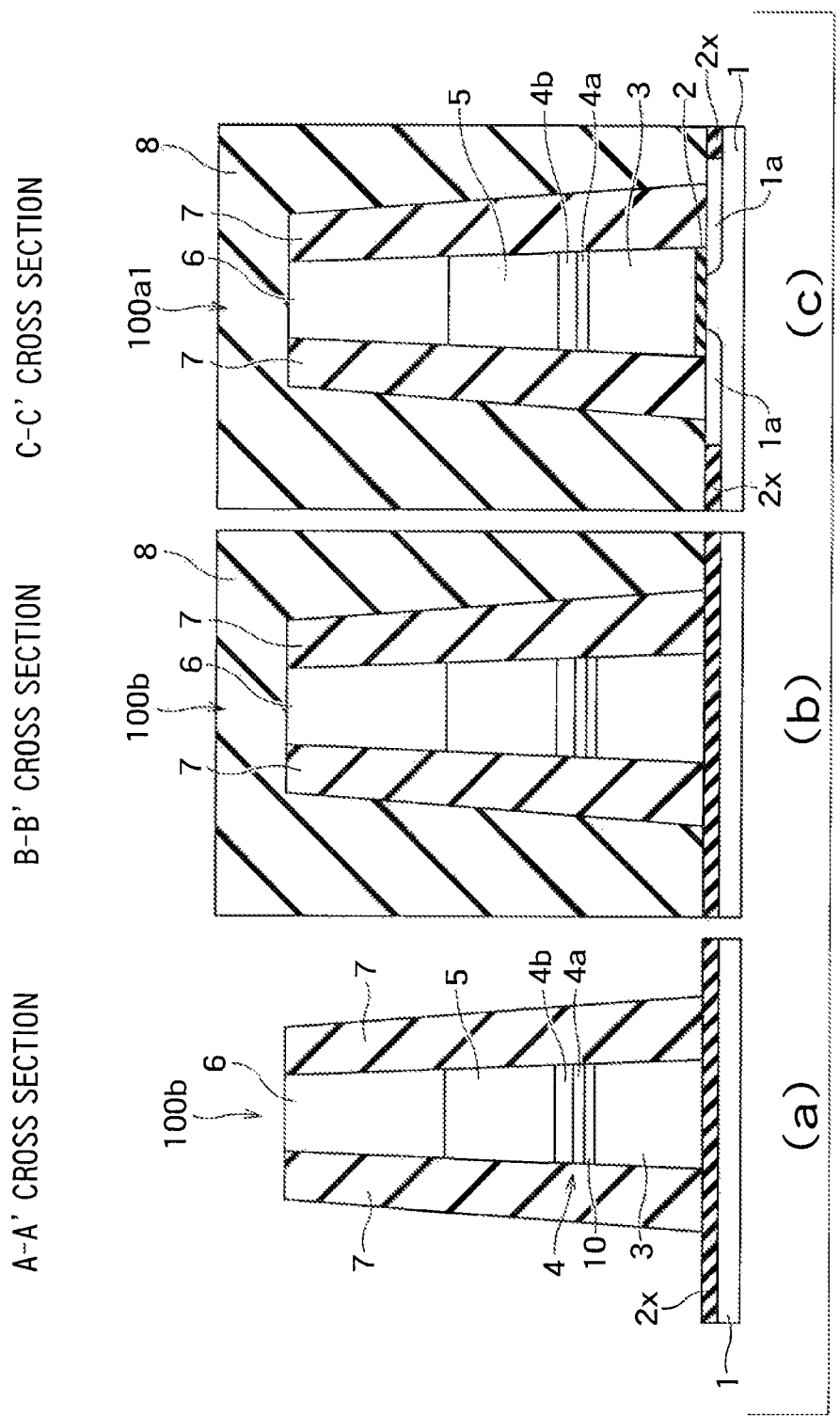
FIG. 16 is cross-sectional views showing examples of cross sections taken along the A-A' line, the B-B' line and the C-C' line in FIG. 15 in steps in the method of manufacturing a semiconductor device according to the second embodiment.

Next, as shown in FIGS. 15 and 16, in the resistive element region 1000, a resist film 8 is selectively formed on the multilayer gate film 1001: and the gate side wall insulating film 7 extending on the semiconductor substrate 1 (FIGS. 16(a) and 16(b)). And in the transistor region 2000, a resist film 8 is formed to cover the whole of the top of the multilayer gate film 100a1 and the top of the gate side wall insulating film 7 (FIG. 16(c)).

In this embodiment, in the resistive element region 1000, the resist film 8 is formed in a line/space pattern on the semiconductor substrate 1 (FIG. 15).

As in the first embodiment, this pattern allows etching in a subsequent wet etching step to proceed from the openings (space parts) in the resist film 8 and the etchant to penetrate to the region under the resist film 8.

Figure 17:
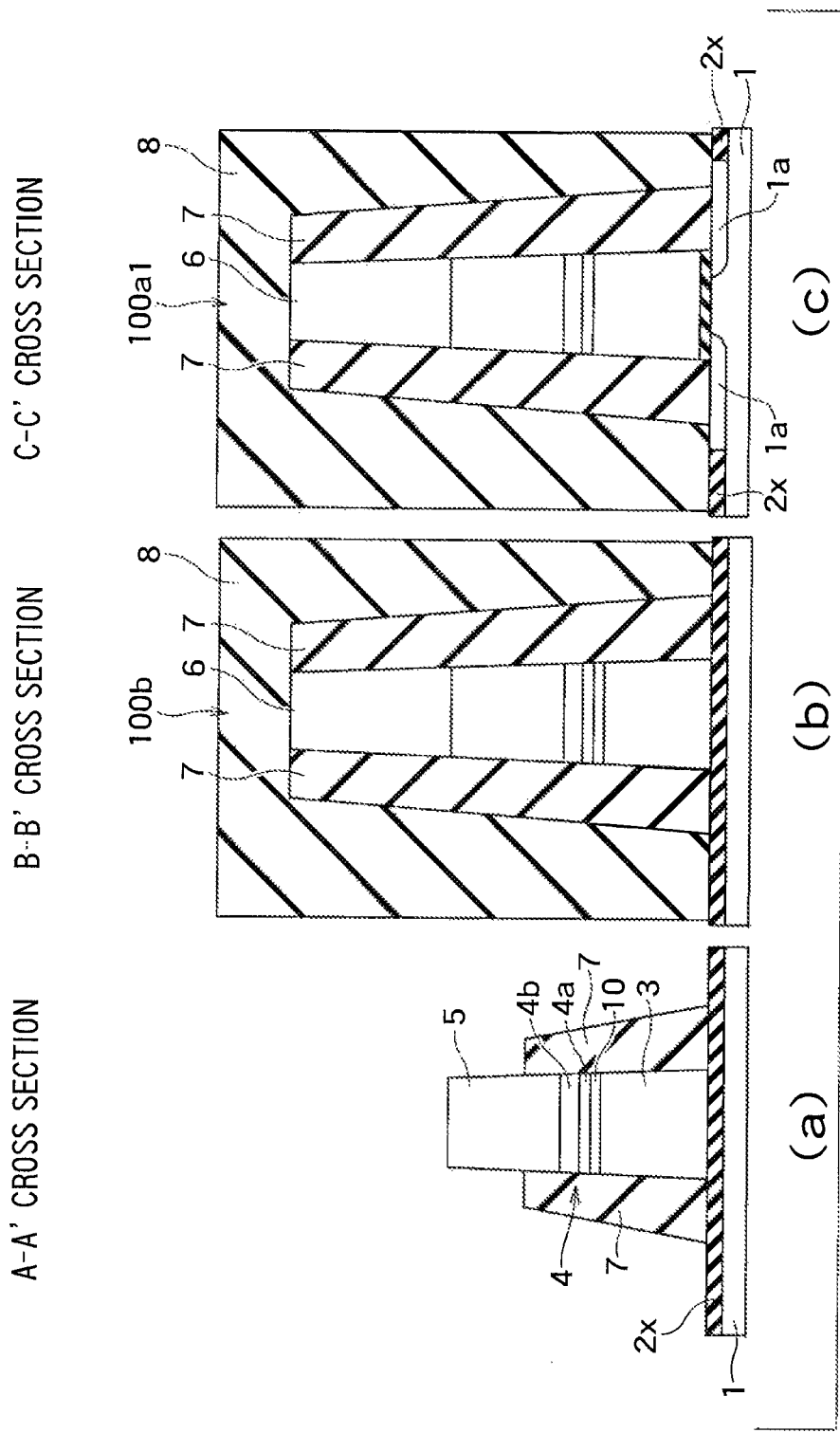
FIG. 17 is cross-sectional views showing examples of cross sections taken along the A-A' line, the B-B' line and the C-C' line in FIG. 15 in steps in the method of manufacturing a semiconductor device according to the second embodiment, is continuous from FIG. 16.

Next, as shown in FIG. 17, as in the first embodiment, using the resist film 8 as a mask, an upper part of the gate side wall insulating film 7 and the hard mask film 6 are selectively removed by dry etching, for example, so as to expose the surface of the metal film 5.

As in the first embodiment, in the etching of the gate side wall insulating film 7, the gate side wall insulating film 7 is etched in such a manner that at least the surface, including the top surface and side surfaces, of the silicon film 3 is not exposed.

Thus, processing of the silicon film 3 occurs only during formation of the multilayer gate film 100b. Metal removal in a subsequent step is performed by highly selective wet etching, so that size variations due to processing of the silicon film 3 can be reduced. That is, variations of the characteristics of the resistive element due to processing of the silicon film 3 can be reduced.

Figure 18:
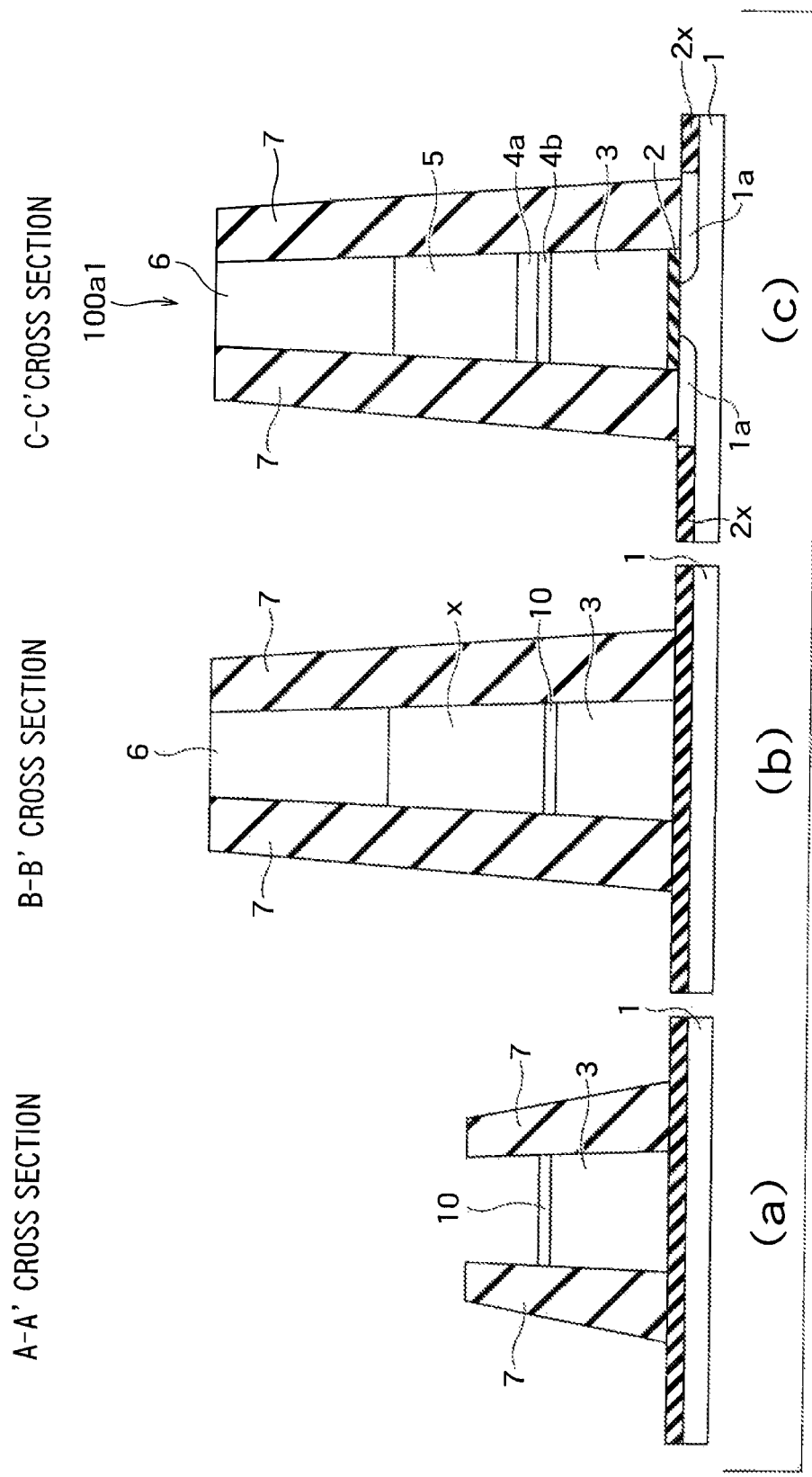
FIG. 18 is cross-sectional views showing examples of cross sections taken along the A-A' line, the B-B' line and the C-C' line in FIG. 15 in steps in the method of manufacturing a semiconductor device according to the second embodiment, is continuous from FIG. 17.

Next, as shown in FIG. 18, in the resistive element region 1000, the metal film 5 and the barrier metal film 4 adjoining the metal film 5 are removed by wet etching in the region where the metal film 5 is exposed and in a region "x" above the silicon film 3 where the hard mask film 6 remains. As in the first embodiment, the etchant used for the wet etching is sulfuric acid/hydrogen peroxide, for example.

In this etching, as described above, the protective film 10, such as a silicon oxide film is not removed.

In the transistor region 2000, the metal film 5 and the barrier metal film 4 are covered with the hard mask film 6 and the gate side wall insulating film 7 and therefore are not removed by the wet etching.

In this way, in the resistive element region 1000, the metal film 5 and the barrier metal film 4 are removed from an upper surface 3a of the silicon film 3. As a result, a polysilicon resistor having a high resistance can be formed in the semiconductor element formed in the poly-metal gate process. That is, a resistive element having a high resistance can be formed while reducing the increase of the circuit footprint.

Since the metal film 5 and the barrier metal film 4 are selectively removed by highly selective wet etching as described above, size variations due to processing of the silicon film 3 can be reduced. That is, variations of the characteristics of the resistive element due to processing of the silicon film 3 can be reduced.

Furthermore, the protective film 10 between the barrier metal film 4 and the silicon film 3 prevents formation of a silicide film that affects the resistance of the resistive element. That is, the resistance can be easily controlled.

After the wet etching, the resist film 8 is removed. After the resist film 8 is removed, as shown in FIG. 19, spin coating or the like is performed to fill the space formed by removal of the metal film 5 and the barrier metal film 4 with a PMD 9a and deposit a PMD 9b to a level higher than an upper surface 6a of the remaining hard mask film 6.

Next, as shown in FIG. 20, a top part of the PMD 9b is planarized by CMP using the remaining hard mask film 6 as a stopper. As in the first embodiment, in the CMP planarization, the hard mask film 6 remains on the metal film 5, so that the dishing that occurs in the comparative example described above can be prevented from occurring.

The resistive element formed in the method of manufacturing a semiconductor device according to this embodiment described above includes the semiconductor substrate 1 with the element isolation insulating film 2x formed thereon, the multilayer structure film extending on the semiconductor substrate 1, the multilayer structure film being formed by the silicon film 3 stacked on the semiconductor substrate 1, the protective film 10 stacked on the silicon film 3 the PMD 9a stacked on the protective film 10, the PMD 9a stacked on the protective film 9a and the hard mask film 6 stacked on the PMD 9a, the gate side wall insulating film 7 formed on the side surface of the multilayer structure film, and the PMD 9b deposited on the semiconductor substrate 1 to the level of the upper surface of the hard mask. In the resistive element, a part of the gate side wall insulating film 7 and a part of the hard mask film 6 are selectively removed so that the PMDs 9a and 9b are connected to each other, the PMDs 9a and 9b are made of the same material, and the silicon film 3 is electrically connected to two resisting electrodes 200a and 200b at the opposite ends thereof.

As in the first embodiment, the resistive element formed in the method of manufacturing a semiconductor device according to the second embodiment is suitable for a multilayer structure, because dishing is unlikely to occur in the CMP planarization.

As described above, according to the method of manufacturing a semiconductor device according to the second embodiment, a resistive element having desired characteristics can be formed with a polysilicon resistor while reducing the increase of the circuit footprint.

Third Embodiment

In an third embodiment, an example of a configuration of a semiconductor storage device, such as an MRAM, that incorporates the semiconductor device manufactured in the method of manufacturing a semiconductor device according to the first or second embodiment described above will be described.

FIG. 21 is a block diagram showing an example of a configuration of a semiconductor storage device according to the third embodiment.

A semiconductor storage device (MRAM, for example) "M" includes a resistive element "R" formed on a semiconductor substrate 1 according to the first or second embodiment described above and a MOS transistor "Tr" formed on the semiconductor substrate 1.

With the semiconductor storage device "M", the resistive element "R" is formed at the same time with the MOS transistor "Tr", and the circuit footprint of the resistive element "R" can be reduced. Furthermore, since occurrence of dishing can be prevented in the CMP planarization, the semiconductor storage device "M" is suitable for forming a multilayer structure.

The embodiments are given only for the sake of illustration, and the scope of the present invention is not limited to the embodiments.

The invention claimed is:

1. A method of manufacturing a semiconductor device in which a resistive element is formed from a silicon film used in a multilayer gate film of a MOS transistor, comprising:
   forming a multilayer film on a semiconductor substrate with an element isolation insulating film selectively formed thereon, the multilayer film including a silicon film stacked on the semiconductor substrate, a barrier metal film that prevents diffusion of a metal into the silicon film stacked on the silicon film, a metal film containing the metal stacked on the barrier metal film and a hard mask film stacked on the metal film;
   forming the multilayer gate film by selectively etching the multilayer film to an upper surface of the semiconductor substrate;
   forming a gate side wall insulating film on a side surface of the multilayer gate film;
   selectively forming a resist film on the multilayer gate film and the gate side wall insulating film extending on the semiconductor substrate in a resistive element region in which the resistive element is to be formed;
   selectively removing by etching an upper part of the gate side wall insulating film and the hard mask film using the resist film as a mask so as to expose a surface of the metal film;
   removing, by wet etching, the metal film and the barrier metal film adjoining the metal film in a region where the metal film is exposed and in a region above the silicon film where the hard mask film remains in the resistive region;
   removing the resist film after the wet etching;
   after the removal of the resist film, embedding a space formed by removal of the metal film and the barrier metal film and depositing a pre-metal dielectric to a level higher than an upper surface of the remaining hard mask film; and
   planarizing by CMP a top part of the pre-metal dielectric using the remaining hard mask film as a stopper.

2. The method of manufacturing a semiconductor device according to claim 1, wherein in a transistor region in which the MOS transistor is to be formed, the resist film is formed to cover the whole of the multilayer gate film and the gate side wall insulating film.

3. The method of manufacturing a semiconductor device according to claim 2, wherein in the resistive element region, in the formation of the multilayer film, a protective film that prevents formation of a silicide is formed on the silicon film, and the barrier metal film is formed on the protective film.

4. The method of manufacturing a semiconductor device according to claim 2, wherein an impurity concentration of the silicon film in the transistor region is different from an impurity concentration of the silicon film in the resistive element region.

5. The method of manufacturing a semiconductor device according to claim 1, wherein in the resistive element region, the resist film is formed in a slit pattern on the semiconductor substrate.

6. The method of manufacturing a semiconductor device according to claim 1, wherein in the etching of the gate side wall insulating film, the gate side wall insulating film is etched in such a manner that at least a surface of the silicon film is not exposed.

7. The method of manufacturing a semiconductor device according to claim 1, wherein the silicon film is a polysilicon film.

8. The method of manufacturing a semiconductor device according to claim 1, wherein the silicon film is electrically connected to two resisting electrodes at opposite ends thereof.

9. The method of manufacturing a semiconductor device according to claim 1, wherein the etchant used for the wet etching is sulfuric acid/hydrogen peroxide.

10. The method of manufacturing a semiconductor device according to claim 1, wherein the barrier metal film contains a titanium film formed on the silicon film and a titanium nitride film formed on the titanium film.

11. The method of manufacturing a semiconductor device according to claim 3, wherein the protective film is a silicon oxide film or a silicon nitride film.

12. The method of manufacturing a semiconductor device a semiconductor storage device according to claim 1, wherein the hard mask film is a silicon nitride film.

13. The method of manufacturing a semiconductor device according to claim 1, wherein the metal film is a tungsten film.

14. The method of manufacturing a semiconductor device according to claim 1, wherein the etching for the multilayer film is dry etching.

15. The method of manufacturing a semiconductor device according to claim 1, wherein the pre-metal dielectric is formed by spin coating.

16. A semiconductor device, comprising:
   a semiconductor substrate with an element isolation insulating film selectively formed thereon;
   a multilayer structure film extending on the semiconductor substrate, the multilayer structure film including a silicon film stacked on the semiconductor substrate, a first pre-metal dielectric stacked on the silicon film and a hard mask film stacked on the first pre-metal dielectric;
   a gate side wall insulating film formed on a side surface of the multilayer structure film; and
   a second pre-metal dielectric formed on the semiconductor substrate to a level of an upper surface of the hard mask,
   wherein a part of the gate side wall insulating film and a part of the hard mask film are selectively removed so that the first pre-metal dielectric and the second pre-metal dielectric are connected to each other,
   the first pre-metal dielectric and the second pre-metal dielectric are made of a same material, and
   the silicon film is electrically connected to two resisting electrodes at opposite ends thereof.

* * * * *